(12) United States Patent
Imaoka et al.

(10) Patent No.: US 7,709,941 B2
(45) Date of Patent: May 4, 2010

(54) RESIN-SEALED SEMICONDUCTOR DEVICE AND METHOD OF MANUFACTURING THE SAME

(75) Inventors: Toshikazu Imaoka, Ogaki (JP); Takeshi Yamaguchi, Gunma (JP); Ryosuke Usui, Ichinomiya (JP); Hiroyuki Watanabe, Bisai (JP); Toshimichi Naruse, Gunma (JP); Atsushi Kato, Kiryu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/054,039

(22) Filed: Feb. 8, 2005

(65) Prior Publication Data

US 2005/0212146 A1    Sep. 29, 2005

(30) Foreign Application Priority Data

Mar. 24, 2004    (JP) .............................. 2004-088054

(51) Int. Cl.
*H01L 23/02*    (2006.01)
(52) U.S. Cl. ............... 257/685; 257/787; 257/E31.117; 257/E51.02; 257/E25.006
(58) Field of Classification Search ................. 257/784, 257/787, 685, 723, 786, E31.117, E31.118, 257/E51.02, E23.116, E25.006, E25.013, 257/E25.018, E25.021, E25.027, E21.614, 257/E23.085
See application file for complete search history.

(56) References Cited

U.S. PATENT DOCUMENTS

| | | | | |
|---|---|---|---|---|
| 6,172,567 | B1 * | 1/2001 | Ueno et al. | 330/285 |
| 6,462,427 | B2 * | 10/2002 | Sakiyama et al. | 257/786 |
| 6,498,055 | B2 * | 12/2002 | Fukuda et al. | 438/127 |

FOREIGN PATENT DOCUMENTS

| JP | 04164352 | * | 6/1992 |
|---|---|---|---|
| JP | 09-017912 | | 1/1997 |
| JP | 11-031704 | | 2/1999 |
| JP | 11-251344 | | 9/1999 |
| JP | 2003-078077 | | 3/2003 |
| JP | 2003-234364 | | 8/2003 |

* cited by examiner

*Primary Examiner*—Davienne Monbleau
*Assistant Examiner*—Dilinh P Nguyen
(74) *Attorney, Agent, or Firm*—Fish & Richardson P.C.

(57) ABSTRACT

A semiconductor pellet and chip components are provided on an insulating substrate, and are sealed with a molding resin that is molded by transfer molding. The chip components are positioned so as to surround the semiconductor pellet on all four sides. The lengthwise directions of the chip components surrounding the semiconductor pellet are aligned in a uniform direction. The insulating substrate is set within a die molding apparatus so that during resin injection, the lengthwise directions of the chip components are aligned substantially perpendicularly to the direction of flow of the injected resin.

4 Claims, 10 Drawing Sheets

RESIN-SEALED SEMICONDUCTOR DEVICE AND METHOD OF MANUFACTURING THE SAME

BACKGROUND OF THE INVENTION

1. Field of the Invention

The present invention relates to a semiconductor device, and more particularly, to a resin-sealed semiconductor device in which a semiconductor pellet and chip components are sealed with a resin, and a method of manufacturing such a device.

2. Description of the Related Art

Semiconductor devices in which the semiconductor pellet and chip components such as resistors are sealed using a molding resin are already well known. One example of a method used for injecting the molding resin is the transfer molding method (for example, see the patent references 1 and 2).

However, in the resin sealing process of the transfer molding method, the sealing region is subjected to high pressure. This pressure within the sealing region becomes even higher in the case of ultra thin devices, as the size of the cross-sectional area perpendicular to the direction of flow of the injected resin is reduced. This pressure from the injected molding resin causes the bonding wires that connect the semiconductor pellet electrodes with lead electrodes and the like to be forced in the direction of the molding resin flow. As a result of this so-called wire flow, a variety of problems can arise, including disconnection of wires and undesired contact between adjacent wires, increasing the possibility of defects, and lowering the production yield of the semiconductor device.

Related Art List
 Patent Reference 1
 Japanese Patent Laid-Open Publication No. Hei 9-17912
 Patent Reference 2
 Japanese Patent Laid-Open Publication No. Hei 11-251344

SUMMARY OF THE INVENTION

The present invention has been devised to resolve these problems, with an object of providing a resin-sealed semiconductor device in which connection failures caused by factors such as bonding wire breakage and mutual contact between bonding wires are suppressed, and a method of manufacturing such a resin-sealed semiconductor device.

One aspect of the resin-sealed semiconductor device of the present invention comprises an insulating substrate with a conductive circuit provided thereon, a semiconductor pellet which is provided on top of the insulating substrate and is connected to the conductive circuit by wire bonding, a plurality of chip components mounted on the insulating substrate, and a sealing resin which seals the semiconductor pellet and the plurality of chip components, wherein the plurality of chip components are positioned so as to shield the semiconductor pellet from the flow of the resin, at least in one direction, during injection of the resin.

By adopting such a configuration, the flow of the injected resin against the semiconductor pellet during resin injection is blocked by the chip components, meaning the level of pressure applied to the region surrounding the semiconductor pellet by the injected resin is moderated, thus suppressing connection failures within the wire bonding.

Another aspect of the resin-sealed semiconductor device of the present invention comprises an insulating substrate with a conductive circuit provided thereon, a semiconductor pellet which is provided on top of the insulating substrate and is connected to the conductive circuit by wire bonding, a plurality of chip components mounted on the insulating substrate, and a sealing resin which seals the semiconductor pellet and the plurality of chip components, wherein the plurality of chip components are positioned so as to surround the semiconductor pellet on all four sides, and the lengthwise directions of the plurality of chip components are aligned in a uniform direction.

In such a configuration, by ensuring that the direction of the injected resin flow is perpendicular to the lengthwise direction of each of the chip components, the level of pressure applied to the region surrounding the semiconductor pellet by the injected resin can be moderated, wire flow can be suppressed, and connection failures within the wire bonding can be considerably reduced. As the distance is narrowed between the semiconductor pellet and a row of chip components comprising a group of chip components in which the lengthwise directions are aligned with one side of the semiconductor pellet, the moderating effect on the level of pressure applied to the region surrounding the semiconductor pellet by the injected resin is enhanced.

Yet another aspect of the resin-sealed semiconductor device of the present invention comprises an insulating substrate with a conductive circuit provided thereon, a semiconductor pellet which is provided on top of the insulating substrate and is connected to the conductive circuit by wire bonding, a plurality of chip components mounted on the insulating substrate, and a sealing resin which seals the semiconductor pellet and the plurality of chip components, wherein the plurality of chip components are positioned so as to surround the semiconductor pellet on all four sides, and the lengthwise directions of the chip components within each chip component row provided along one side of the semiconductor pellet are aligned with the direction of that side of the semiconductor pellet.

By adopting such a configuration, the level of pressure applied to the region surrounding the semiconductor pellet by the injected resin can be moderated, wire flow can be suppressed, and connection failures within the wire bonding can be considerably reduced, regardless of the direction in which the injected resin flow approaches the semiconductor pellet. As the distance is narrowed between the semiconductor pellet and the plurality of chip components, the moderating effect on the level of pressure applied to the region surrounding the semiconductor pellet by the injected resin is enhanced.

Yet another aspect of the resin-sealed semiconductor device of the present invention comprises an insulating substrate with a conductive circuit provided thereon, a semiconductor pellet which is provided on top of the insulating substrate and is connected to the conductive circuit by wire bonding, a plurality of chip components mounted on the insulating substrate, and a sealing resin which seals the semiconductor pellet and the plurality of chip components, wherein the plurality of chip components are positioned around the periphery of the insulating substrate, and the lengthwise directions of the plurality of chip components are aligned in a uniform direction.

In such a configuration, by ensuring that the direction of the injected resin flow is perpendicular to the lengthwise direction of each of the chip components, the level of pressure applied to the region surrounding the semiconductor pellet by the injected resin can be moderated, wire flow can be suppressed, and connection failures within the wire bonding can be considerably reduced.

Yet another aspect of the resin-sealed semiconductor device of the present invention comprises an insulating substrate with a conductive circuit provided thereon, a semiconductor pellet which is provided on top of the insulating substrate and is connected to the conductive circuit by wire bonding, a plurality of chip components mounted on the insulating substrate, and a sealing resin which seals the semiconductor pellet and the plurality of chip components, wherein the plurality of chip components are positioned around the periphery of the insulating substrate, and the lengthwise directions of the chip components within each chip component row provided along one side of the insulating substrate are aligned with the direction of that side of the insulating substrate.

By adopting such a configuration, the level of pressure applied to the region surrounding the semiconductor pellet by the injected resin can be moderated, wire flow can be suppressed, and connection failures within the wire bonding can be considerably reduced, regardless of the direction in which the injected resin flow approaches the insulating substrate.

Yet another aspect of the resin-sealed semiconductor device of the present invention comprises an insulating substrate with a conductive circuit provided thereon, a semiconductor pellet which is provided on top of the insulating substrate and is connected to the conductive circuit by wire bonding, a plurality of chip components mounted on the insulating substrate, and a sealing resin which seals the semiconductor pellet and the plurality of chip components, wherein two or more chip component rows formed from the plurality of chip components are positioned close to one side of the semiconductor pellet, the lengthwise directions of the plurality of chip components are aligned with that side of the semiconductor pellet, and the position of each chip component within each chip component row, in terms of the direction along the chip component row, is adjusted so as to be offset relative to each chip component within each adjacent chip component row.

In such a configuration, by ensuring that the direction of the injected resin flow is perpendicular to the lengthwise direction of each of the chip components within each of the chip component rows, the pressure applied by the injected resin can be moderated even more effectively, and wire flow can be suppressed even more effectively.

Yet another aspect of the resin-sealed semiconductor device of the present invention comprises an insulating substrate with a conductive circuit provided thereon, a semiconductor pellet which is provided on top of the insulating substrate and is connected to the conductive circuit by wire bonding, a plurality of chip components mounted on the insulating substrate, and a sealing resin which seals the semiconductor pellet and the plurality of chip components, wherein a chip component row formed from the plurality of chip components is positioned close to one side of the semiconductor pellet, the lengthwise directions of the plurality of chip components are aligned with that side of the semiconductor pellet, and at least one dummy chip component is provided within the chip component row.

By adopting such a configuration, even in those cases where the specific structure of the resin-sealed semiconductor device means that the chip components cannot be positioned in the desired locations, by employing a dummy chip component in those locations where a real chip component cannot be positioned, the flow of the injected resin towards the semiconductor pellet can still be reliably blocked.

Another aspect of the present invention provides a method of manufacturing a semiconductor device in which a semiconductor pellet, which is provided on top of an insulating substrate with a conductive circuit provided thereon and is connected to the conductive circuit by wire bonding, and a plurality of surface-mounted chip components are sealed with a sealing resin, comprising: positioning the plurality of chip components along at least one side of the semiconductor pellet with the lengthwise directions of the chip components aligned with the direction along that side of the semiconductor pellet; mounting the insulating substrate in the cavity of a die molding apparatus so that the lengthwise directions of the plurality of chip components are arrayed substantially perpendicularly to the direction of resin injection; and injecting the resin towards the semiconductor pellet and the chip components.

According to this method of manufacturing a semiconductor device, because the flow of the injected resin is shielded by the plurality of chip components, wire flow of the bonding wires connected to the semiconductor pellet can be suppressed, thus enabling suppression of connection failures within the wire bonding during resin sealing.

Combinations of various elements of the above aspects are also deemed to fall within the scope of the present invention.

DETAILED DESCRIPTION OF THE PREFERRED EMBODIMENTS

First Embodiment

Figure 1:
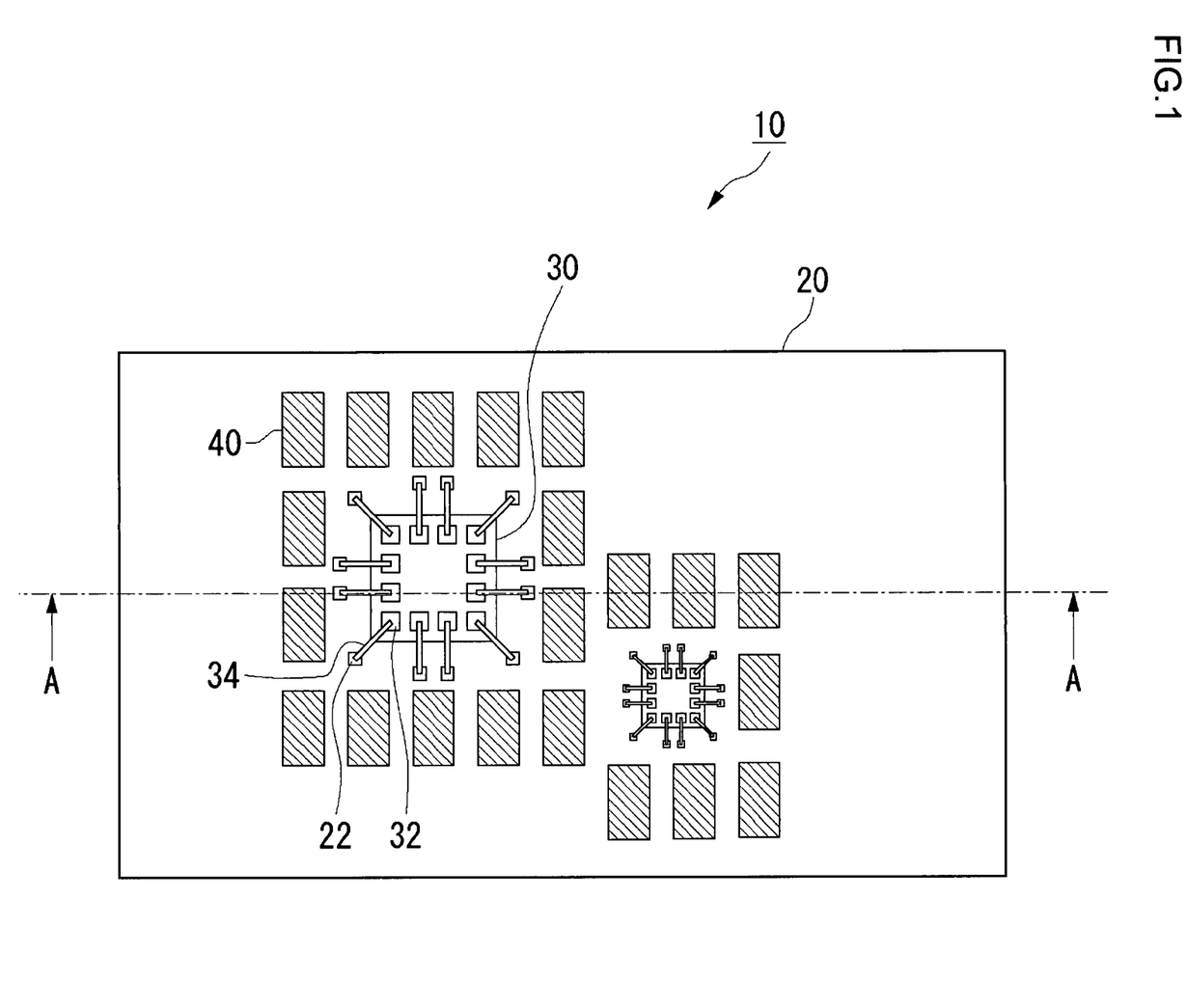
FIG. 1 is a plan view of a semiconductor device according to a first embodiment.
Figure 2:
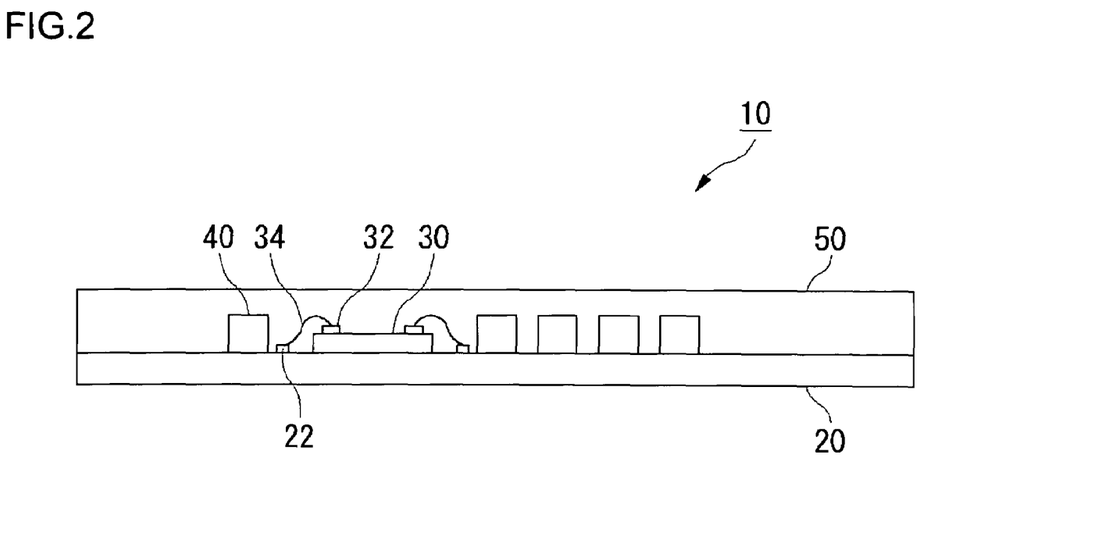
FIG. 2 is a cross-sectional view taken along the line A-A in FIG. 1.

FIG. 1 is a plan view of a semiconductor device 10 according to a first embodiment, and FIG. 2 is a cross-sectional view taken along the line A-A in FIG. 1. The semiconductor device 10 comprises an insulating substrate 20, a semiconductor pellet 30, a plurality of chip components 40, and a molding resin 50. The semiconductor pellet 30 and the plurality of chip components 40 are provided on top of the insulating substrate 20, and are sealed with the molding resin 50 using a transfer molding method. The molding resin 50 is omitted from the plan view of FIG. 1.

Examples of suitable materials for forming the insulating substrate 20 include thermosetting resins such as melamine derivatives like BT resin, liquid crystal polymers, epoxy resins, PPE resins, polyimide resins, fluororesins, phenol resins, and polyamide bismaleimide resins. The insulating substrate 20 may comprise either a single layer or multiple layers.

Electrode pads 32 on the semiconductor pellet 30 are connected electrically by wire bonding to lead electrodes 22 of a conductive circuit formed on the insulating substrate 20 (but not shown in the figures), and gold bonding wires 34 are used for the connections between the electrode pads 32 and the lead electrodes 22 on the insulating substrate 20.

The chip components 40 are arranged so as to surround the semiconductor pellet 30 on all four sides, and are also connected to the conductive circuit provided on top of the insulating substrate 20. Specific examples of the chip components 40 include capacitors, inductors, resistors, and the like. The sizes of the chip components 40 are standardized to a uniform shape, and so-called "1005 size," "0603 size," and "0402 size" components are ideal. In this description, "1005 size" refers to chip components 40 with dimensions of 1.0 mm×0.5 mm×0.5 mm, "0603 size" refers to chip components 40 with dimensions of 0.6 mm×0.3 mm×0.3 mm, and "0402 size" refers to chip components 40 with dimensions of 0.4 mm×0.2 mm×0.2 mm. In this manner, the projected area of the chip components 40 in a direction perpendicular to the lengthwise direction of the chip components is greater than the projected area in a direction perpendicular to the direction of the short side of the chip components 40. The thickness of the molding resin 50 is preferably at least as thick as the height of the chip components 40.

Examples of suitable materials for the molding resin 50 include thermosetting resins such as epoxy resins. The molding resin 50 may also contain fillers such as glass.

In the first embodiment, the lengthwise directions of the plurality of chip components 40 surrounding each of the semiconductor pellets 30 are all aligned in a uniform direction. Prior to injection of the molding resin 50 using a transfer molding method, the semiconductor device 10 is positioned so that the lengthwise directions of the chip components 40 are aligned perpendicularly to the direction of flow of the molding resin 50. This positioning means that the flow of the molding resin 50 towards the semiconductor pellets 30 is effectively blocked by the chip components 40, meaning the pressure that the molding resin 50 applies to the gold bonding wires 34 connected to the semiconductor pellets 30 is considerably reduced. As a result, the occurrence of undesirable phenomena caused by wire flow during injection of the molding resin 50, such as the disconnection of gold bonding wires 34 from either the electrode pads 32 or the lead electrodes 22, or undesirable mutual contact between adjacent gold bonding wires 34, can be suppressed, enabling the occurrence of connection failures within the gold bonding wire 34 of the semiconductor device 10 to be reduced. This reduction in the occurrence of connection failures within the gold bonding wire 34 contributes to an improvement in the production yield of the semiconductor device 10.

The basic construction of the semiconductor devices 10 of the examples 2 and above described below is the same as that of the first embodiment, with the exception of the positioning of the chip components 40. Accordingly, the descriptions below omit reference to any identical structures, and focus solely on the characteristic features of each example.

Second Embodiment

Figure 3:
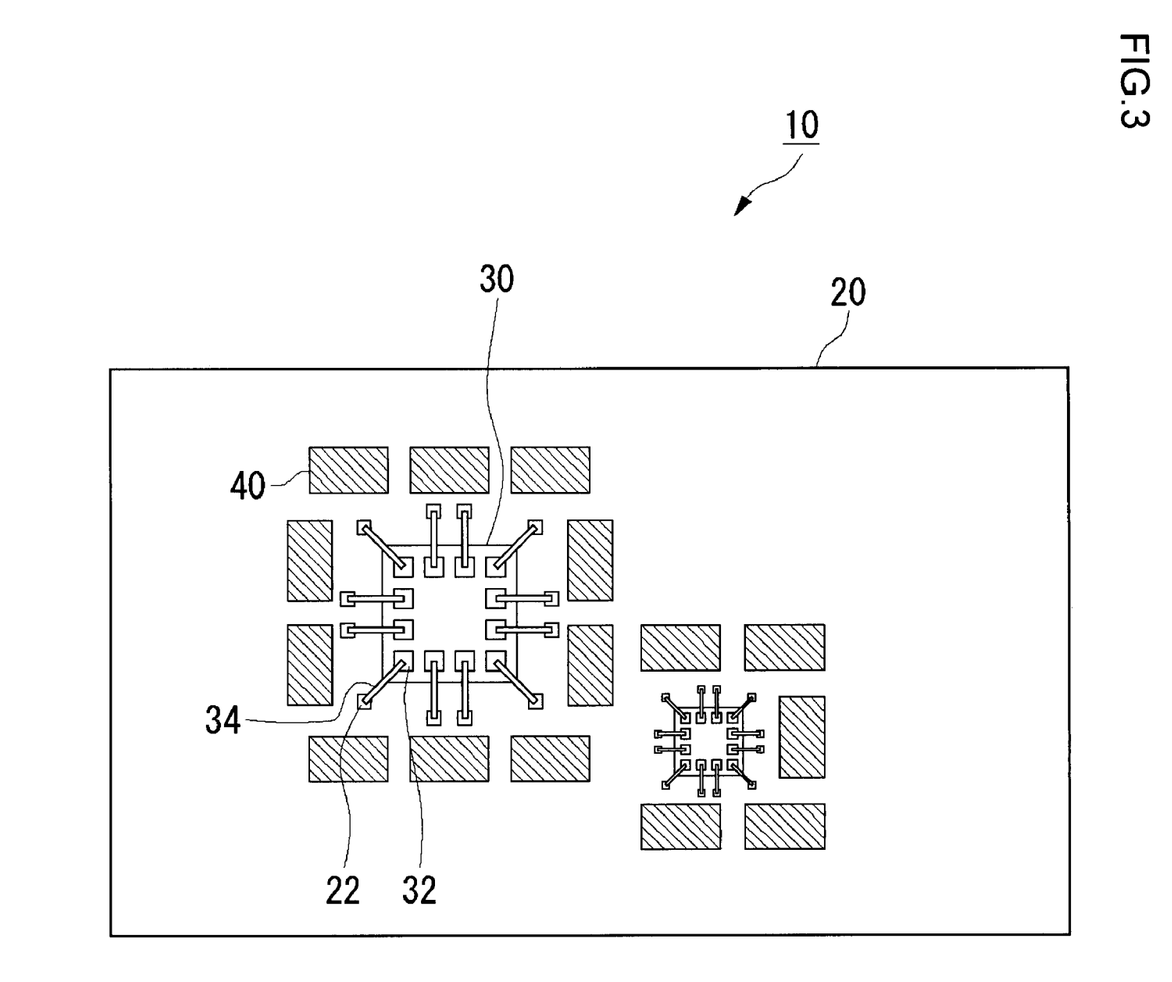
FIG. 3 is a plan view of a semiconductor device according to a second embodiment.

FIG. 3 is a plan view of a semiconductor device 10 according to a second embodiment. The molding resin 50 is omitted from FIG. 3. In the semiconductor device 10 of the second embodiment, the lengthwise directions of the plurality of chip components 40 provided around each side of each of the semiconductor pellets 30 are arranged so as to match the direction of the corresponding side. As a result, the flow of the molding resin 50 towards the semiconductor pellets 30 is effectively blocked by the chip components 40, regardless of which side of the semiconductor device 10 is positioned facing the flow of the molding resin 50 when the resin is injected under transfer molding conditions, meaning wire flow of the gold bonding wires 34 of the semiconductor device 10 can be suppressed, and connection failures within the gold bonding wire 34 can be reduced.

Third Embodiment

Figure 4:
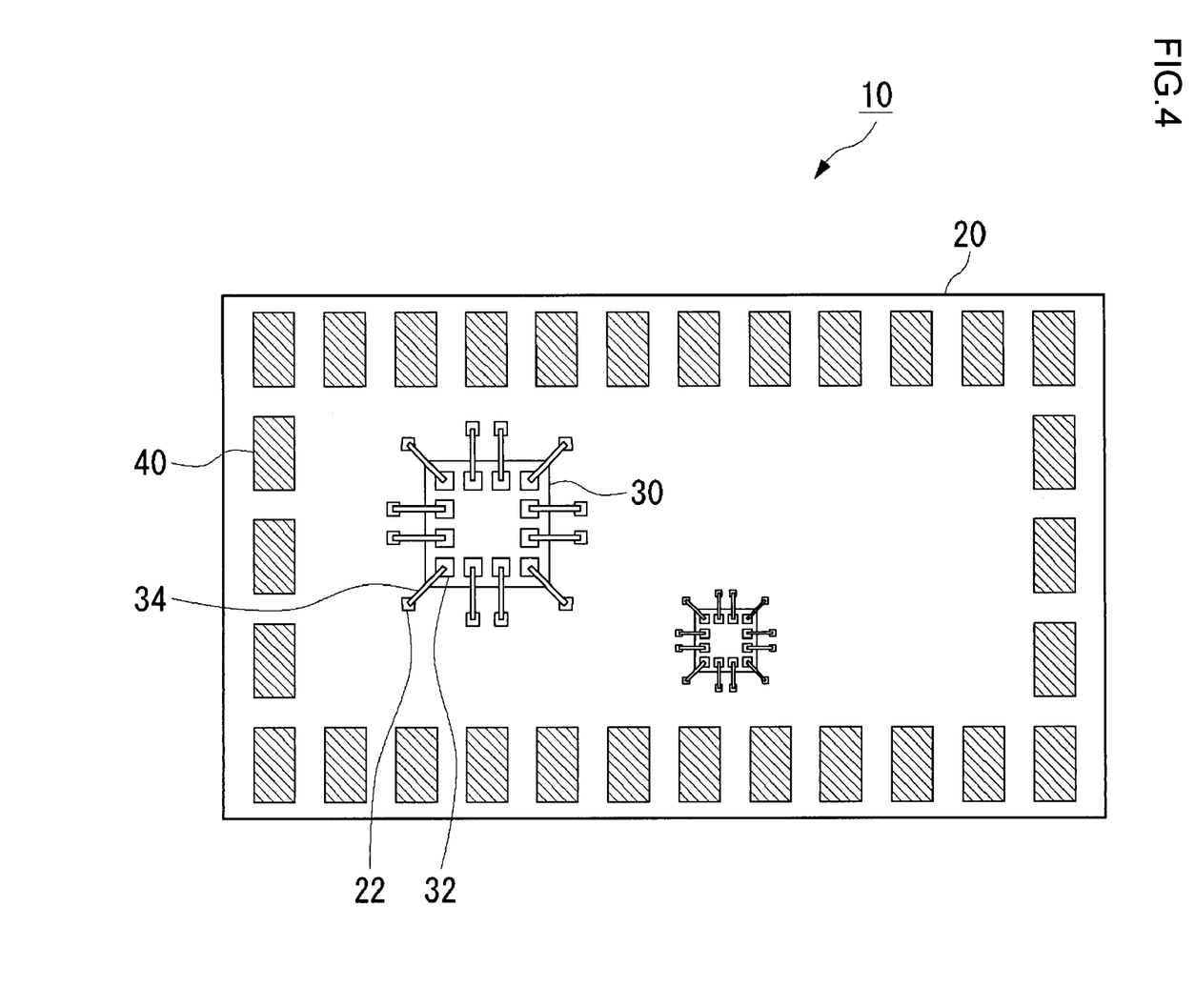
FIG. 4 is a plan view of a semiconductor device according to a third embodiment.

FIG. 4 is a plan view of a semiconductor device 10 according to a third embodiment. The molding resin 50 is omitted from FIG. 4. In the semiconductor device 10 of the third embodiment, the plurality of chip components 40 are positioned around the periphery of the insulating substrate 20. The lengthwise directions of the chip components 40 are aligned in a uniform direction. With this configuration, by positioning the semiconductor device 10, prior to the injection of the molding resin 50 using a transfer molding method, so that the lengthwise directions of the uniformly aligned chip components 40 are arrayed perpendicularly to the direction of flow of the molding resin 50, the flow of the molding resin 50 towards the semiconductor pellets 30 is effectively blocked by the chip components 40, meaning wire flow of the gold bonding wires 34 of the semiconductor device 10 can be suppressed, and connection failures within the gold bonding wire 34 can be reduced.

Fourth Embodiment

Figure 5:
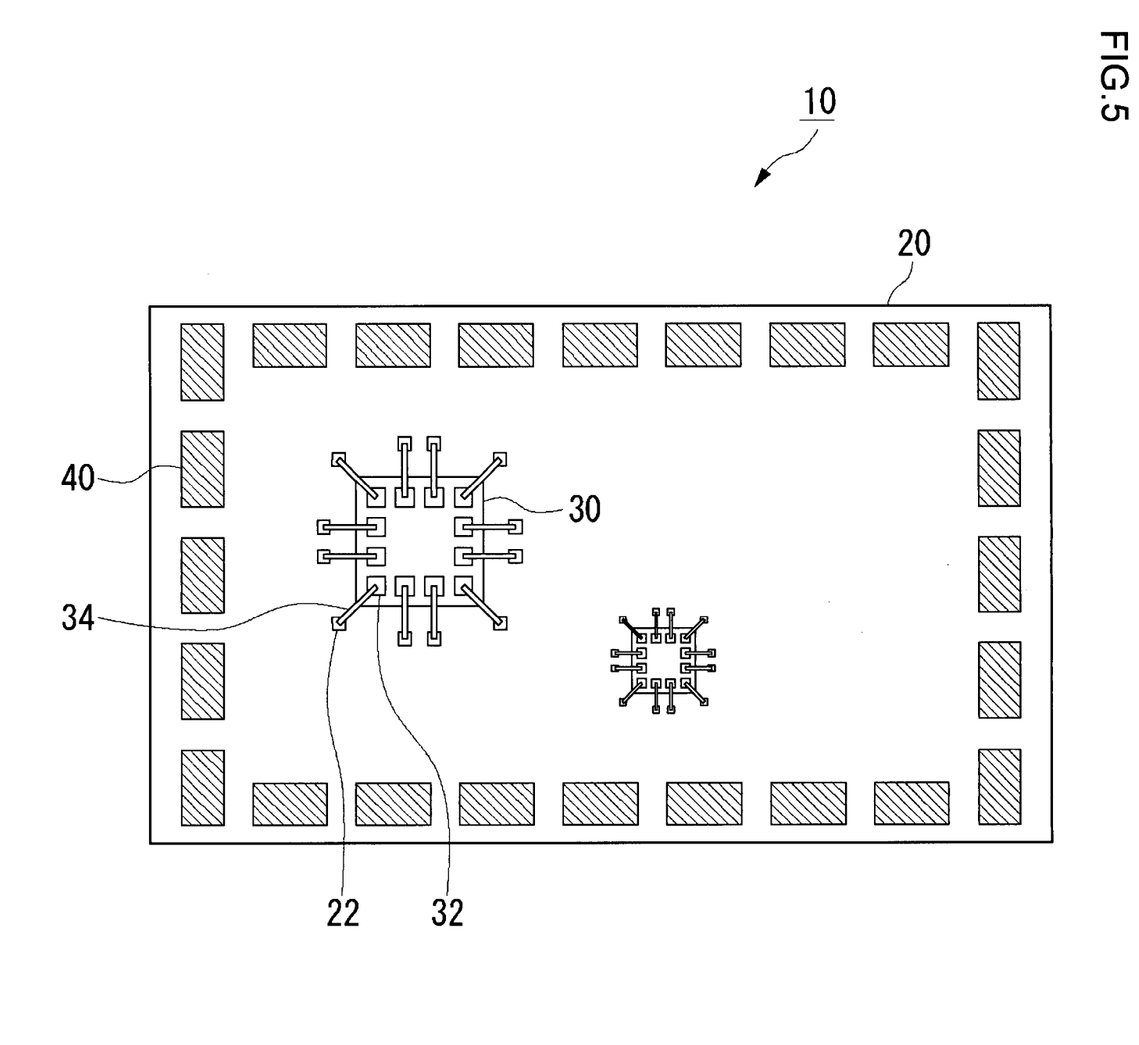
FIG. 5 is a plan view of a semiconductor device according to a fourth embodiment.

FIG. 5 is a plan view of a semiconductor device 10 according to a fourth embodiment. The molding resin 50 is omitted from FIG. 5. In the semiconductor device 10 of the fourth embodiment, the plurality of chip components 40 are positioned around the periphery of the insulating substrate 20, in a similar manner to the third embodiment, but unlike the third embodiment, the lengthwise directions of the chip components 40 are aligned with the corresponding side of the semiconductor pellets 30. As a result, the flow of the molding resin 50 towards the semiconductor pellets 30 is blocked by the chip components 40, regardless of which side of the semiconductor device 10 is positioned facing the flow of the molding resin 50 when the resin is injected under transfer molding conditions, meaning wire flow can be suppressed.

Fifth Embodiment

Figure 6:
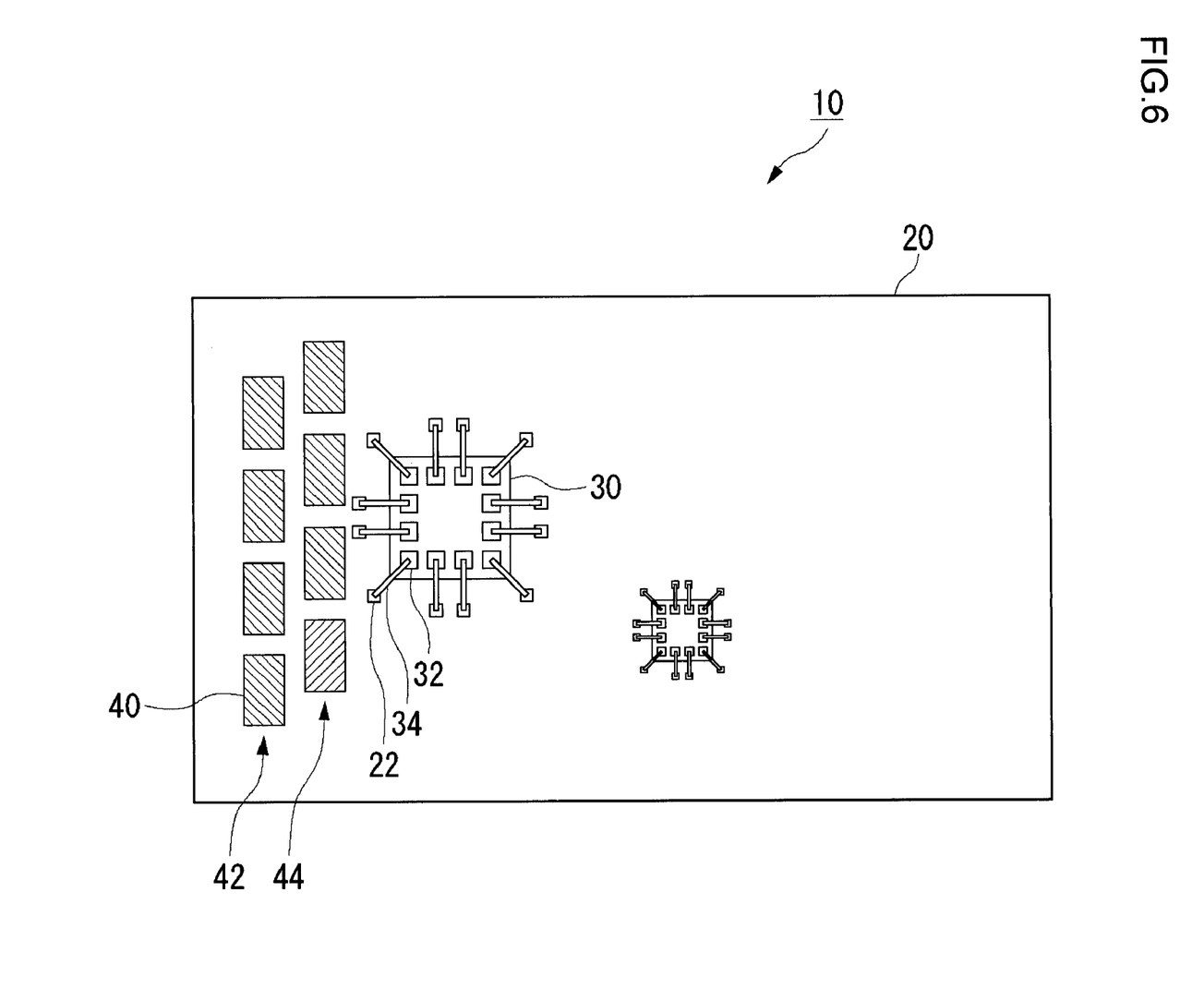
FIG. 6 is a plan view of a semiconductor device according to a fifth embodiment.
Figure 7:
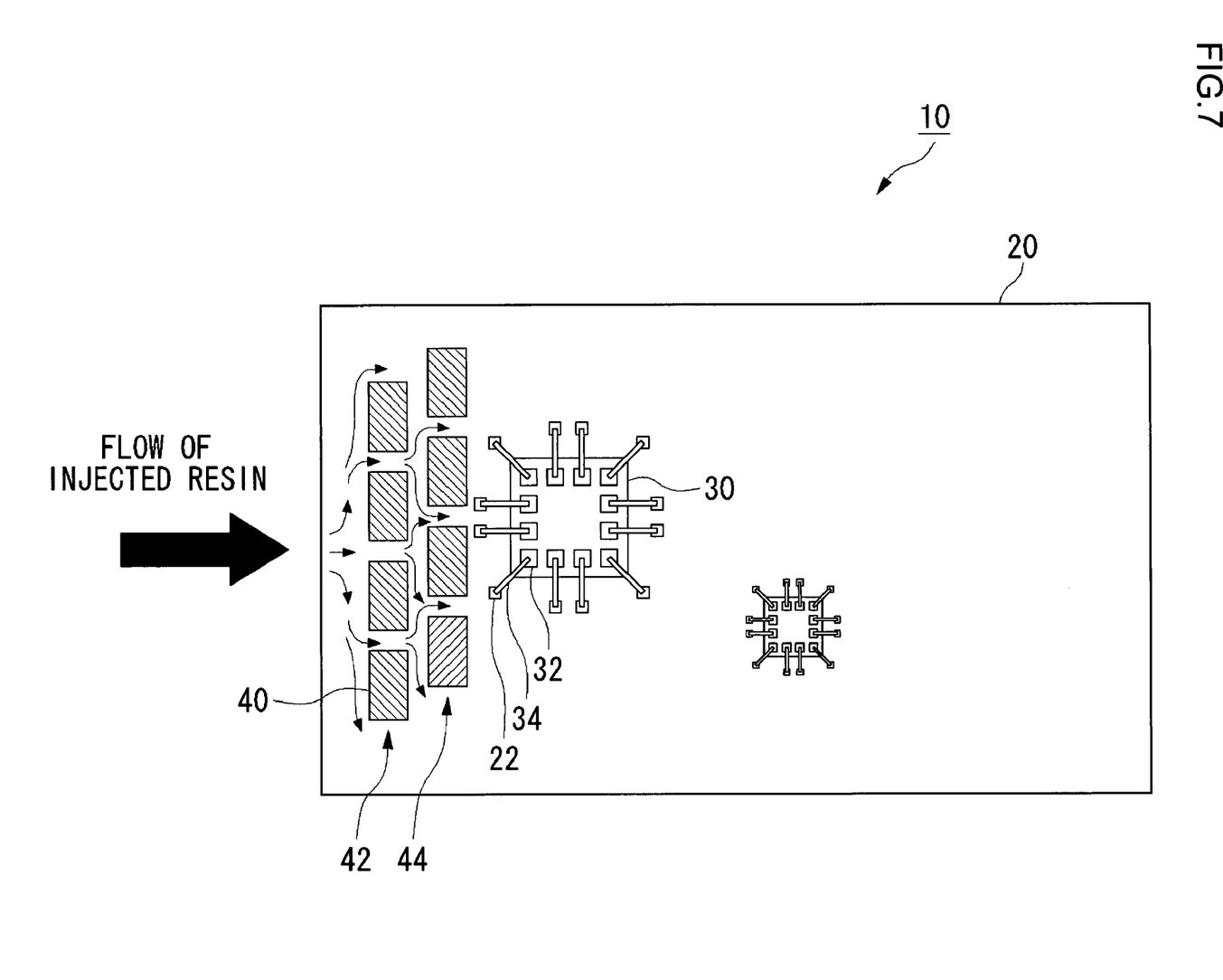
FIG. 7 is a plan view showing the flow of resin during resin sealing of the semiconductor device according to the fifth embodiment.

FIG. 6 is a plan view of a semiconductor device 10 according to a fifth embodiment. The molding resin 50 is omitted from FIG. 6. In the semiconductor device 10 of the fifth embodiment, the plurality of chip components 40 are positioned within a chip component row 42 and a chip component row 44, which are located close to one side of the semiconductor pellet 30, and are aligned in parallel with that side. The chip components 40 arrayed within the chip component row 42 and the chip component row 44 are positioned with the lengthwise direction of each chip aligned along the same direction as the row. In addition, the chip components 40 of the chip component row 42 are offset relative to the chip components 40 of the chip component row 44 when viewed from a direction perpendicular to the row direction. In other words, the gaps between the chip components 40 of the chip component row 42 are offset relative to the gaps between the chip components 40 of the chip component row 44, by an amount equivalent to half the length of a chip component 40 in the row direction. With this configuration, by positioning the semiconductor device 10, prior to the injection of the molding resin 50 using a transfer molding method, so that the row directions of the chip component row 42 and the chip component row 44 are arrayed perpendicularly to the direction of flow of the molding resin 50, the flow of the molding resin 50 towards the semiconductor pellets 30 can be even more effectively blocked by the chip components 40. In other words, as can be seen in FIG. 7, the flow of the molding resin 50 towards the semiconductor pellets 30 is first blocked by the chip component row 42, resulting in an attenuation of the resin pressure. The flow of the molding resin 50 then passes through the gaps between the chip components of the chip component row 42 and is blocked again by the chip component row 44, resulting in a further reduction in the pressure.

In the fifth embodiment, by increasing the number of chip component rows to three or more, and positioning the chip components 40 of each chip component row so that the chip components 40 of adjacent chip component rows are offset when viewed from a direction perpendicular to the row direction, the flow of the molding resin 50 towards the semiconductor pellets 30 can be even more effectively blocked.

Sixth Embodiment

Figure 8:
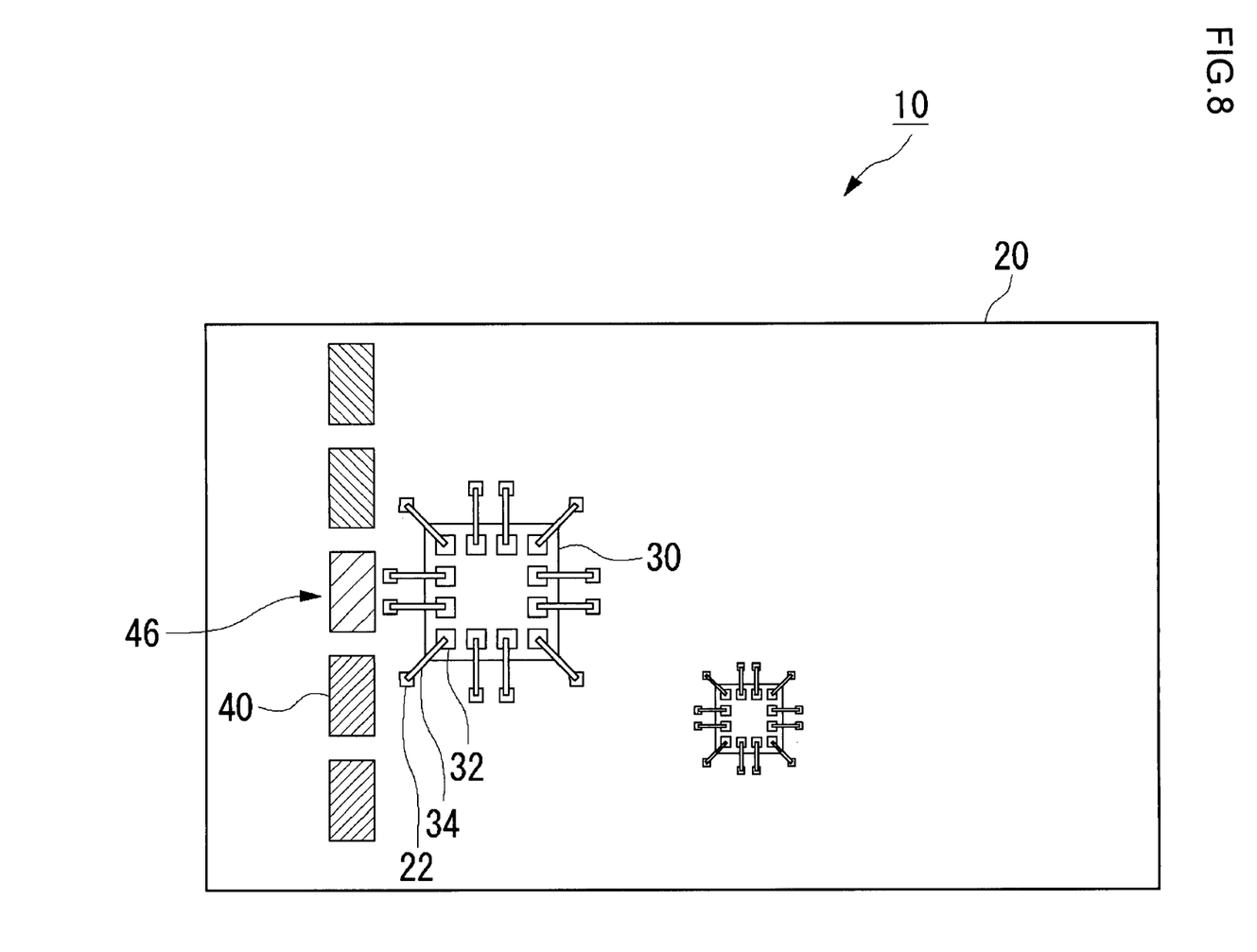
FIG. 8 is a plan view of a semiconductor device according to a sixth embodiment.

FIG. 8 is a plan view of a semiconductor device 10 according to a sixth embodiment. The molding resin 50 is omitted from FIG. 8. In the, semiconductor device 10 of the sixth embodiment, a plurality of chip components 40 and at least one dummy chip component 46 are positioned close to one side of the semiconductor pellet 30, and are aligned in parallel with that side. In this description, the dummy chip component 46 is a component that is not required for operation of the semiconductor device 10. Examples of dummy chip components include chip components 40 that are not connected to the wiring on the insulating substrate 20, and mock components with the same outer shape as the chip components 40. The lengthwise directions of the chip components 40 and the dummy chip component 46 are aligned along the direction of the row of chips. In such a configuration, even in those cases where the structure or operation of the resin-sealed semiconductor device 10 means that a chip component 40 cannot be positioned in a certain desired location, or in those cases where a chip component 40 need not be placed in a certain desired location, by employing a dummy chip component 46 at the desired location, the flow of the molding resin 50 towards the semiconductor pellet 30 can still be reliably blocked.

(Method of Manufacturing a Semiconductor Device)

An insulating substrate is prepared, and a conductive circuit is provided on the insulating substrate. A semiconductor pellet is cut from a wafer, the cut semiconductor pellet is mounted on the insulating substrate, and the electrode pads of the semiconductor pellet are connected to lead electrodes provided in the conductive circuit using wire bonding. A plurality of chip components or dummy chip components are provided around the periphery of the semiconductor pellet mounted on the insulating substrate, using a positioning arrangement according to one of the above examples 1 through 6.

Figure 9A:
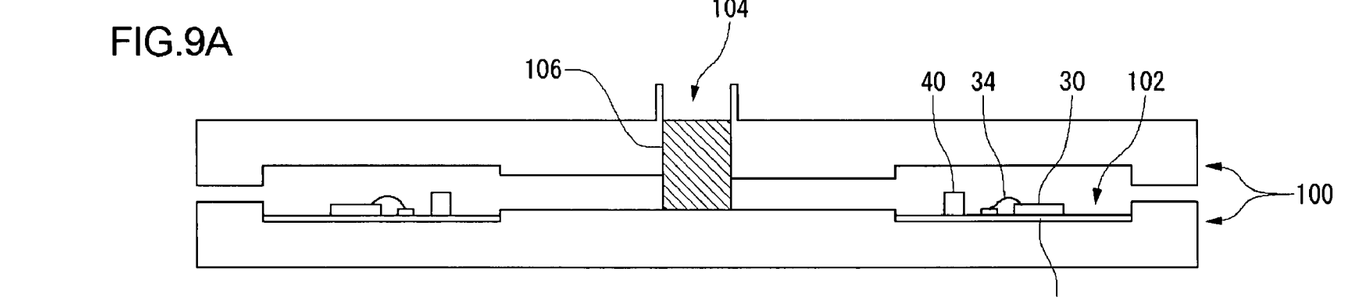
FIGS. 9A, 9B and 9C are diagrams showing a series of diagrams showing the sequence of operations in a method of sealing a semiconductor device.
Figure 9B:
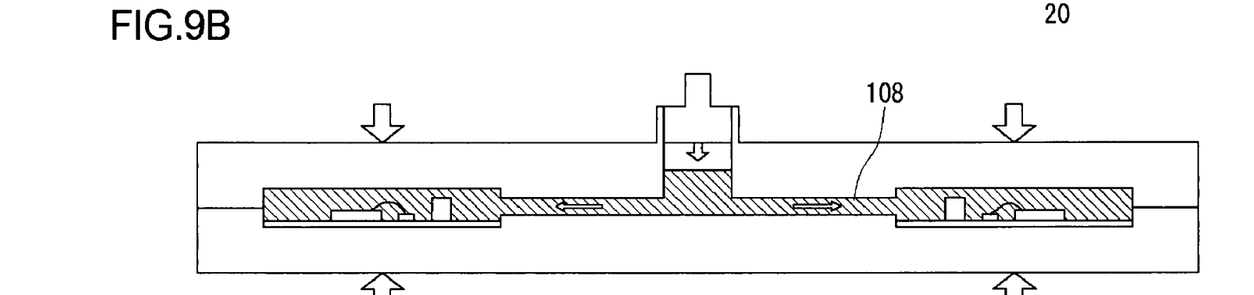
Figure 9C:
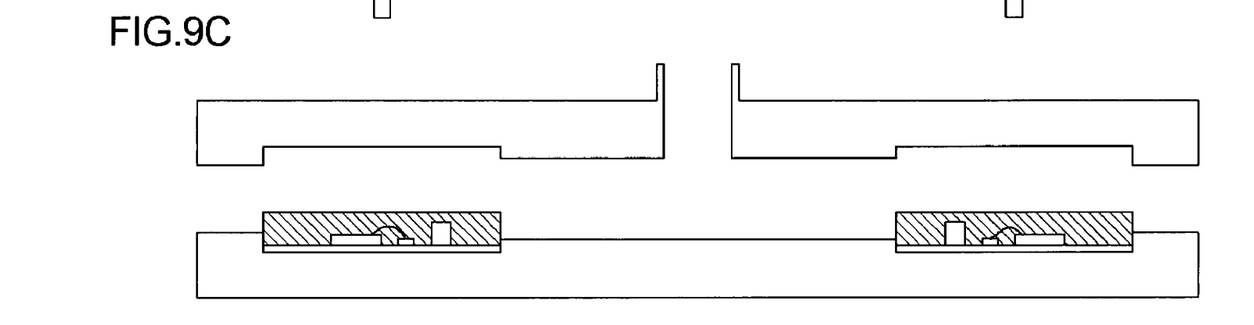

The semiconductor pellet and the plurality of chip components are then sealed with a resin. FIGS. 9A, 9B and 9C shows the sequence of operations in a method of sealing the semiconductor device 10.

Figure 10:
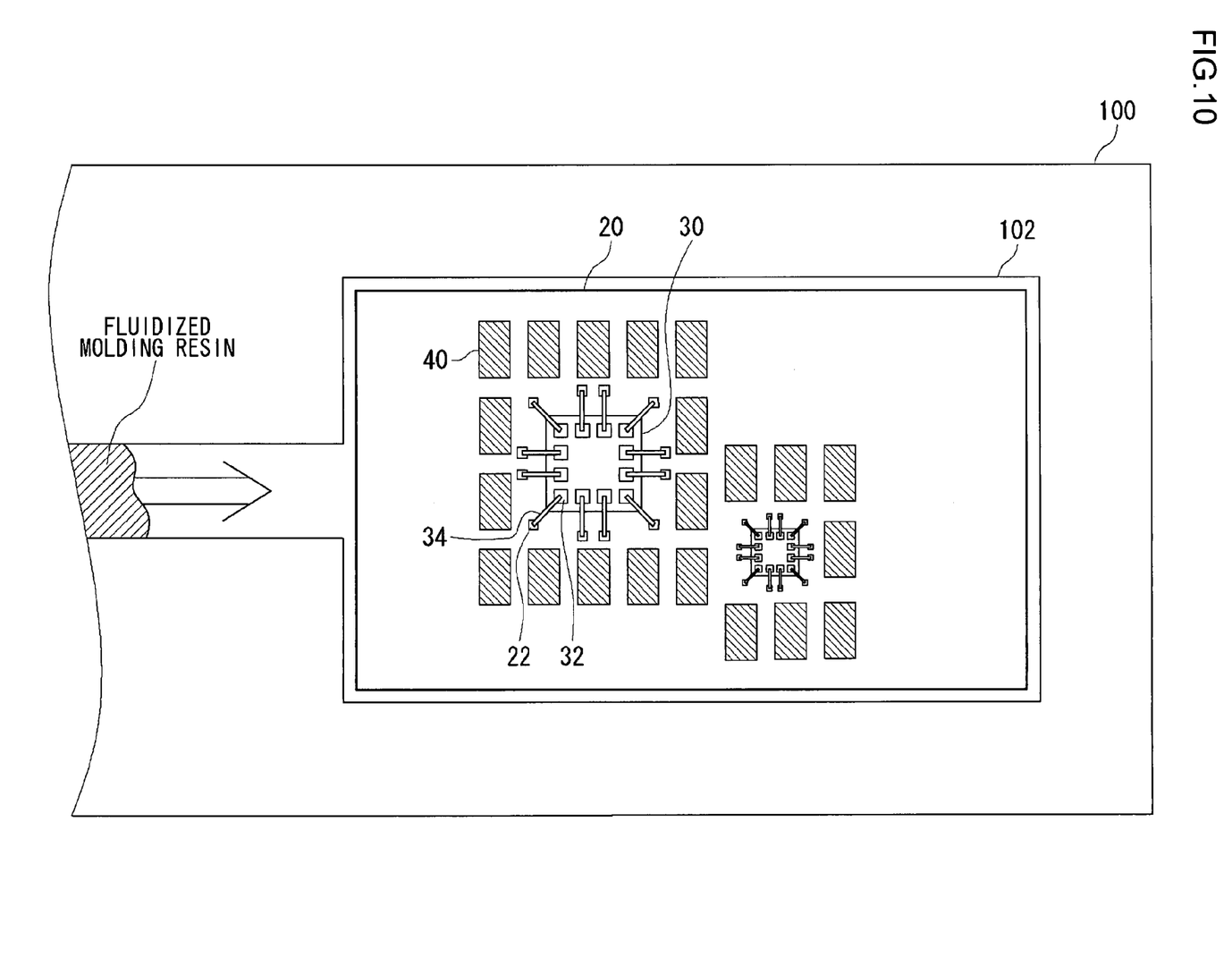
FIG. 10 is a plan view showing an insulating substrate, with semiconductor pellets and chip components mounted thereon in accordance with the first embodiment, installed inside the cavity of a die molding apparatus.

FIG. 9A: A solid molding resin tablet 106 is set within the pot 104 of a die molding apparatus 100. The insulating substrate 20 with the semiconductor pellets 30 and chip components 40 mounted thereon is then installed within a cavity 102 of the die molding apparatus 100. FIG. 10 is a plan view showing an insulating substrate 20, with semiconductor pellets 30 and chip components 40 mounted thereon in accordance with the first embodiment, installed inside the cavity 102 of the die molding apparatus 100. The insulating substrate 20 is oriented inside the cavity 102 so that the lengthwise directions of the chip components 40 are aligned perpendicularly to the flow direction of the fluidized molding resin.

FIG. 9B: Returning to FIG. 9B, the molding resin tablet 106 is melted at a die temperature of 170 to 180° C., and pressure is then applied to force the melted resin into the runners 108 inside the die molding apparatus 100.

FIG. 9C: The injected molding resin is retained under pressure within the die molding apparatus 100 for 45 to 90 seconds, and once the molding resin has undergone thermosetting, the die molding apparatus 100 is opened, and the insulating substrate 20 with the molding resin formed thereon is removed.

In this manner, by aligning the lengthwise directions of the chip components 40 positioned near the semiconductor pellets 30 so as to be perpendicular to the direction of the resin flow during the transfer molding resin injection, the semiconductor pellets 30 are effectively shielded from the resin flow by the chip components 40. As a result, damage to the gold bonding wire 34 caused by resin pressure can be reduced, meaning the connections provided by the gold bonding wire 34 can be favorably maintained. Although the angle between the direction of the resin flow and the lengthwise directions of the chip components 40 positioned near the semiconductor pellets 30 is preferably perpendicular, the angle need not be strictly perpendicular. Provided the angle is within ±10° of being perpendicular, the resin flow can still be blocked by the long sides of the chip components 40, and this still meets the definition of "perpendicular" within the description of the present invention.

When semiconductor devices with the configurations described in the examples 1 through 6 were prepared using the manufacturing method described above, wire flow was suppressed, and a significant reduction in the occurrence of connection failures within the gold bonding wire was confirmed.

In addition, this wire flow suppression effect was confirmed as being particularly marked in those cases where the thickness of the molding resin 50 was no more than 2.0 times the height of the chip components 40, regardless of whether 1005 size, 0603 size, or 0402 size components were used.

Furthermore, in those cases where a plurality of different chip component sizes were used, for example, when 1005 size components and 0603 size components were mixed, the wire flow suppression effect was confirmed as still being particularly marked provided the thickness of the molding resin 50 was no more than 2.0 times the height of the largest chip components 40.

The present invention is not restricted to the embodiments described above, and it should be understood by a person skilled in the art that a variety of modifications such as design alterations can be made, and that such modified embodiments can also be included within the scope of the present invention.

In the examples described above, semiconductor pellets and chip components were mounted on insulating substrates, but the present invention can also be applied to ISB (Integrated System in Board: a registered trademark) packaging known as coreless SIP (System in Package), which while comprising a wiring pattern of copper or the like, does not use a core for supporting the semiconductor pellets and the like.

What is claimed is:

1. A resin-sealed semiconductor device comprising:
   an insulating substrate having a conductive circuit thereon;
   a semiconductor pellet on top of the insulating substrate, wherein the semiconductor pellet is connected to the conductive circuit by wire bonding;
   a plurality of chip components on the insulating substrate; and
   a sealing resin which seals the semiconductor pellet and the plurality of chip components, wherein
   the plurality of chip components includes two or more chip component rows along a side of the semiconductor pellet,
   a lengthwise direction of each of the plurality of chip components extends in parallel with the side of the semiconductor pellet,
   a position of each chip component within each chip component row is offset, in a direction parallel to the side of the semiconductor pellet, relative to each chip component within each adjacent chip component row,
   the two or more chip component rows include a first chip component row and an adjacent second chip component row located between the first chip component row and the semiconductor pellet, and
   second chip components in the second chip component row are located so as to entirely block gaps between first chip components in the first chip component row, when viewed in a direction perpendicular to the side of the semiconductor pellet.

2. The resin-sealed semiconductor device according to claim 1, wherein the semiconductor pellet is wire bonded to a lead electrode of the conducting circuit, and the lead electrode is adjacent to a side of the second chip component row that is adjacent to the semiconductor pellet.

3. The resin-sealed semiconductor device according to claim 1 further comprising at least one dummy chip component different from each of the plurality of chip components, wherein the dummy chip component does not function as a chip component and is within one of the two or more chip component rows.

4. The resin-sealed semiconductor device according to claim 1, wherein the second chip components that block gaps between the first chip components are located at a plurality of locations in the second chip component row.

* * * * *